United States Patent [19]

Dubrow et al.

[11] Patent Number: 4,900,877
[45] Date of Patent: Feb. 13, 1990

[54] SHIELDING AND SEALING GASKETS

[75] Inventors: Robert S. Dubrow, Redwood City; Christine J. Holland, San Mateo; Randolph W. Chan, Palo Alto; Albert R. Martin, Oakland; Dennis C. Siden, Portola Valley; Paul B. Germeraad, Menlo Park, all of Calif.

[73] Assignee: Raychem Corporation, Menlo Park, Calif.

[21] Appl. No.: 218,417

[22] Filed: Jul. 12, 1988

Related U.S. Application Data

[63] Continuation of Ser. No. 132,641, Dec. 12, 1987, abandoned, which is a continuation of Ser. No. 2,827, Jan. 13, 1987, abandoned.

[51] Int. Cl.$^4$ .............................................. H05K 9/00
[52] U.S. Cl. ................................. 174/35 GC; 361/424
[58] Field of Search .................. 174/35 GC; 361/424; 428/260; 277/235 R

[56] References Cited

U.S. PATENT DOCUMENTS

| | | | |
|---|---|---|---|
| 2,477,267 | 7/1949 | Robinson | 174/35 GC |
| 2,885,459 | 5/1959 | Pulsifer et al. | 174/35 |
| 3,019,281 | 1/1962 | Hartwell | 174/35 |
| 3,026,367 | 3/1962 | Hartwell | 174/35 |
| 3,126,440 | 3/1964 | Goodloe | 174/35 |
| 3,230,294 | 1/1966 | McAdams | 174/35 GC |
| 3,431,348 | 3/1969 | Nellis et al. | 174/35 |
| 3,542,939 | 11/1970 | Mintz | 174/35 |
| 3,566,064 | 2/1971 | Nellis | 200/168 |
| 3,583,930 | 6/1971 | Ehrreich et al. | 174/35 GC X |
| 3,609,104 | 9/1971 | Ehrreich | 252/511 |
| 3,708,871 | 1/1973 | Mintz | 29/592 |
| 4,037,009 | 7/1977 | Severinsen | 174/35 GC X |
| 4,098,633 | 7/1978 | Kersten | 174/35 GC X |
| 4,434,541 | 3/1984 | Powers, Jr. | 29/526 |
| 4,507,359 | 3/1985 | Powers, Jr. | 428/328 |
| 4,634,207 | 1/1987 | Debbaut | 174/76 X |

FOREIGN PATENT DOCUMENTS 0196767 10/1986 European Pat. Off. .

Primary Examiner—Leo P. Picard
Assistant Examiner—David A. Tone
Attorney, Agent, or Firm—Herbert G. Burkard; Bernard J. Lyons

[57] ABSTRACT

This invention provides E.M.I. gaskets for electrically shielding and environmentally sealing the space between two surfaces which comprises a metallic electrically conductive deformable structure adapted for forming electrical contact with said surfaces and/or providing electrical shielding in the space between said surfaces; and a gel material for sealing the space between said surfaces having a cone penetration value of about 100 to about 350 ($10^{-1}$ mm) and an ultimate elongation of at least 200% and being present in sufficient amount and positioned to provide environmental seal between said surfaces and to provide environmental protection for said metallic structure. The gel may encapsulate the entire metallic structure so that portions of the metallic structure pierces through the gel when the gasket is installed to make electrical contact. Alternatively portions of the metallic structure may extend beyond the surface of the gel and the gel deforms to cover exposed portions of the metallic structure when the gasket is installed. The gasket of this invention provides moisture seal and is resistant to corrosion.

12 Claims, 5 Drawing Sheets

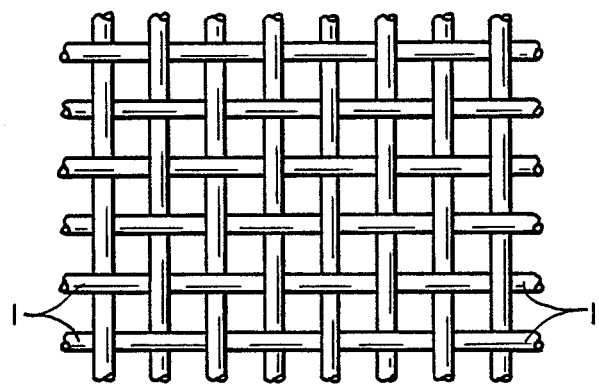
FIG_1A
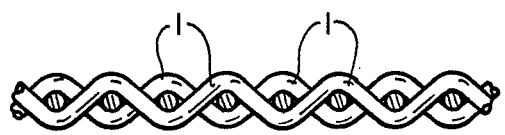
FIG_1B
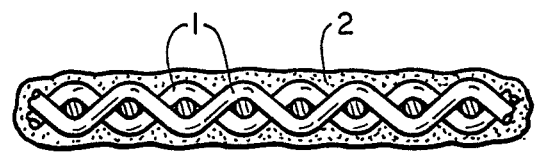
FIG_1C
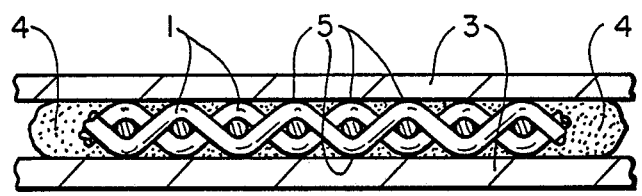
FIG_1D

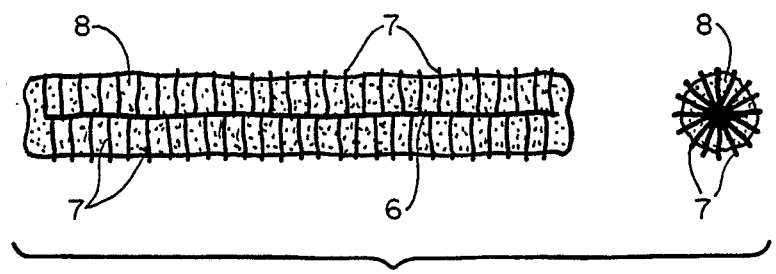
FIG_2A
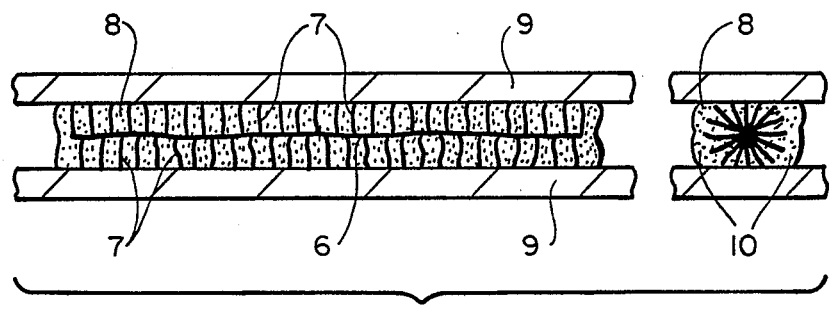
FIG_2B
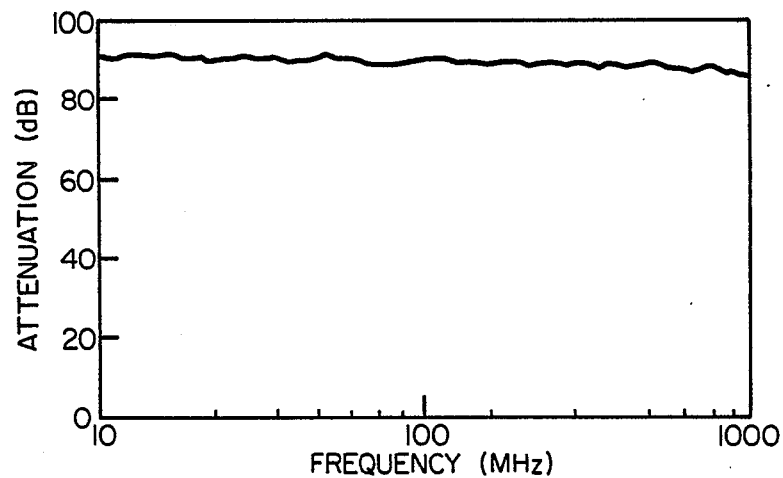
FIG_3

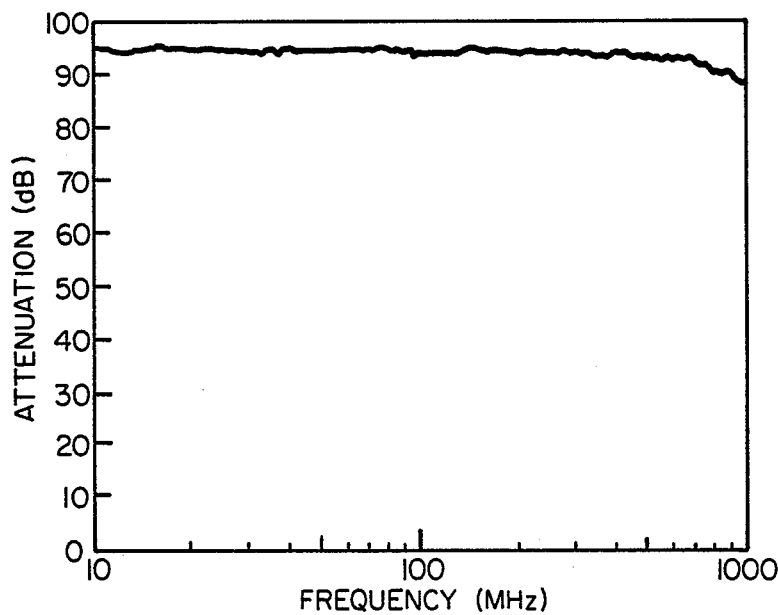
FIG_4
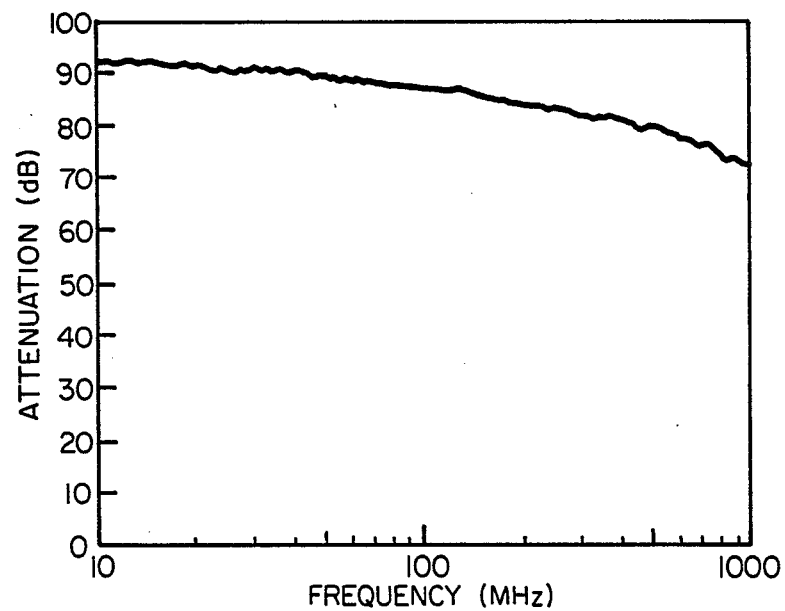
FIG_5

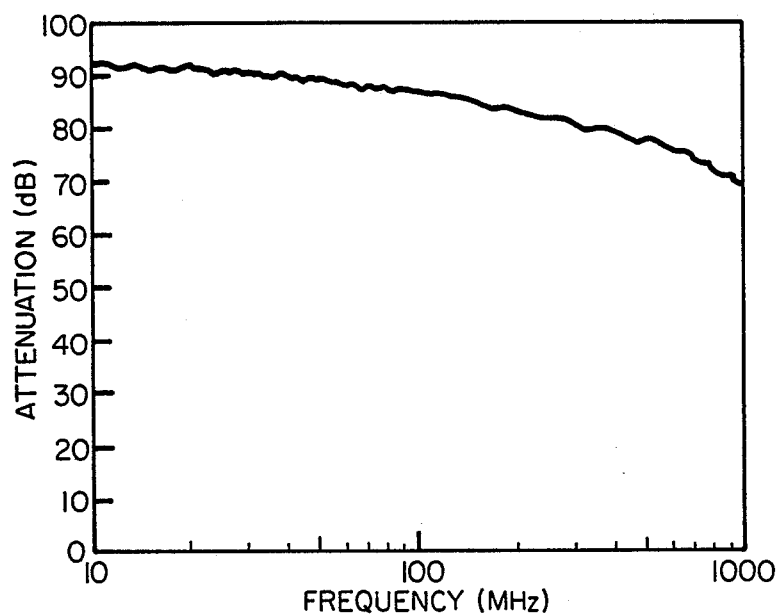
FIG_6
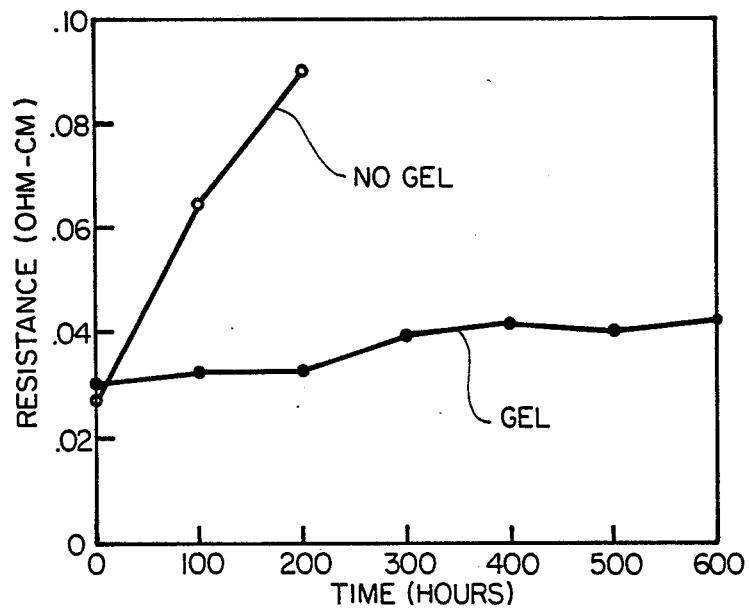
FIG_7

SHIELDING AND SEALING GASKETS

This is a continuation of Ser. No. 132,641, filed on Dec. 12, 1987, now abandoned, which is a continuation of Ser. No. 2,827 filed on Jan. 13, 1987, now abandoned.

FIELD OF THE INVENTION

This invention relates to gaskets for electromagnetic energy interference (E.M.I.) shielding and for environmentally sealing the space between two surfaces.

BACKGROUND OF THE INVENTION

E.M.I. shielding is for providing protection against interference from electromagnetic energy, including radio frequency interference (R.F.I.), which protection may be to protect an electronic device from external E.M.I. and R.F.I. or may be to prevent E.M.I. or R.F.I. from escaping from an electrical device, or both. Environmental sealing is for protection against moisture, corrosion, dust, insects and similar environmental contamination encountered by electrical or electronic devices when in service.

E.M.I. gaskets and seals have been made from the combination of rubber or elastomeric materials and wires or metal filaments. These gaskets are intended to function by the wires contacting the surfaces between which the gasket is assembled to provide the E.M.I. shielding and the rubber or elastomeric material is intended to provide the environmental seal when compressed between the intended surfaces. Examples of such gaskets are disclosed in U.S. Pat. Nos. 2,885,459 to Pulsifer et al.; 3,019,281 and 3,026,367 to Hartwell; 3,126,440 to Goodloe; 3,431,348 to Nellis et al.; 3,542,939 to Mintz; 3,566,064 to Nellis; and 3,708,871 to Mintz.

In another form, E.M.I. gaskets have been provided in the form of a plastic binder containing electrically conductive particles, such as aluminum, coated with silver. Examples of this type of gasket are disclosed in U.S. Pat. Nos. 3,583,930 to Ehrreich et al. and 4,434,541 and 4,507,359 to Powers.

The disclosures of the above references are incorporated herein by reference.

In another form, E.M.I. gaskets have been provided with a flexible foam rubber core having a wire exterior cover on the foam core such as a knitted or braided or otherwise woven wire fabric cover. The foam rubber core is intended to provide resilience to assure that the wire cover makes good electrical contact when compressed between the intended surfaces and is also intended to provide an environmental seal between the intended surfaces.

It has been found that the above gaskets exhibit a number of problems in actual use, including corrosion or rusting of the metallic or wire portion and failure of the plastic, rubber, elastomer or foam to provide the desired environmental seal. In an attempt to eliminate corrosion and rusting, some gaskets have been made of noble metal wires, such as silver, which adds significantly to the cost of the gasket and does not always solve the corrosion and oxidation problems. In some of the above gaskets, a moisture leak path exists where the wires contact the surfaces because the rubber, elastomer or foam material does not adequately seal around and between the wires or metallic structures and the surfaces to prevent migration of moisture into or through the gasket area. Any migration of moisture into or through the gasket area frequently causes corrosion of the metal in the gasket and corrosion or other problems in the electrical or electronic device being protected by the gasket.

It has been recognized in the art that the above gaskets do not fulfill the desired functions. Frequently when the gaskets provide satisfactory E.M.I. shield, they do not provide the desired environmental sealing and/or the gasket itself has corrosion problems. Alternatively when the gaskets provide adequate environmental sealing, they frequently do not provide the desired E.M.I. shielding. Consequently, it has also been recognized in the art that in many cases it has been necessary to separate the two functions and have an exterior conventional environmental gasket, such as an elastomeric or rubber O-ring, and a separate interior E.M.I. gasket, such as a wire mesh. This arrangement is undesirable, however, because it takes extra space, requires extra design, engineering and machining and increases installation difficulties, costs and risks of improper installation.

In view of the above, it is an object of this invention to provide an E.M.I. gasket which provides electrical shielding and provides environmental sealing for not only the space between two surfaces but also for the metallic components which provide the electrical shielding in the gasket. Another object of this invention is to provide a corrosion resistant gasket which need not be made of nobel metal components. Another object of this invention is to provide a method of E.M.I. shielding and environmentally sealing electrical or electronic components using such a gasket.

SUMMARY OF THE INVENTION

In one aspect, this invention provides an E.M.I. gasket for electrically shielding and environmentally sealing the space between two surfaces comprising:

(a) a metallic electrically conductive deformable structure adapted for forming electrical contact with said surfaces and or providing electrical shielding in the space between said surfaces; and (b) a gel material for sealing the space between said surfaces having a cone penetration value of about 100 to about 350 ($10^{-1}$ mm) and an ultimate elongation of at least 200% and being present in sufficient amount and positioned to provide environmental seal between said surfaces and to provide environmental protection for said metallic structure.

In another aspect, this invention provides the above gasket wherein the gel material covers the metallic structure and the metallic structure is adapted and positioned such that portions thereof pierce through the gel material and contact the surfaces when the gasket is compressed between the surfaces.

In another aspect, this invention provides the above gasket wherein at least a portion of the metallic structure is positioned outside the gel material and the gel material is positioned so as to deform into sealing contact with the surfaces and deform around the metallic structure to seal exposed portions of the metallic structure when the gasket is compressed between the surfaces.

In another aspect, this invention provides a method of providing E.M.I. shielding and environmental sealing the space between two surfaces by positioning a gasket as defined above between the two surfaces and compressing said gasket between said surfaces to deform the gel material and establish electrical contact of the metallic structure with the surfaces.

BRIEF DESCRIPTION OF THE DRAWINGS

FIGS. 1a, 1b and 1c and a gasket of the present invention wherein the metallic structure is contained within the gel material; and FIG. 1d shows the gasket installed between two surfaces.

FIG. 2a shows a gasket of the present invention wherein a portion of the metal structure is outside the gel material; and FIG. 2b shows such a gasket installed between two surfaces.

FIG. 3 shows the shielding effectiveness of a woven wire cloth shown in FIGS. 1a and 1b and measured according to Example 1.

FIG. 4 shows the shielding effectiveness of a gasket of this invention illustrated in FIG. 1c and measured in accordance with Example 2.

FIG. 5 shows the shielding effectiveness of a knitted wire strap measured in accordance with Example 3.

FIG. 6 shows the shielding effectiveness of a gasket according to this invention made from the knitted wire strap of Example 3 in accordance with and measured in accordance with Example 4.

FIG. 7 shows the corrosion test results in accordance with Example 5.

DESCRIPTION OF THE INVENTION

The gaskets of the present invention comprise a metal structure component and a gel material component which are assembled in a relationship as set forth above in the summary of the invention. The metallic structure is positioned so that it can pierce through the gel to make electrical contact with the surfaces when the gasket is compressed between the surfaces. Alternatively, the metal structure may be exposed and the gel is positioned such that the gel will deform around exposed portions of the metallic structure to environmentally seal the exposed metallic structure and to contact and environmentally seal the surfaces when the gasket is compressed between the surfaces.

Such metallic structures may be any suitable structure such as woven or non-woven wire fabric or conductive fibers, for example they may be wire bristle structures such as the structure of a pipe cleaner or bottle brush where the wires are radially oriented, or may be of the structure of an expanded metal mesh. Other suitable metallic structures which will form electrical contact between the surfaces and provide the desired electrical shielding properties will be apparent to those skilled in the art. The woven wire metallic structure may be in the form of a circular or flat knit fabric which has good flexibility and conformability and provides good electrical shielding. The fabric may also be woven or braided wire, metallic or conductive fibers or fabrics which may contain non-metallic fibers provided sufficient conductive structure is present to provide the desired electrical contact with the surfaces and provided the desired shielding.

A preferred form of the gasket of the present invention is composition or wherein the metallic structure is within the gel material or wherein the gel material at least coats all parts of the metallic structure and whereby the metallic structure pierces through the gel material or the gel coating to form the electrical contact with the surfaces between which the gasket is compressed.

The gel material useful in the present invention may be any composition or material having the physical properties of a cone penetration value from about 100 to about 350 ($10^{-1}$ mm) as measured by ASTM D-937-77, and an ultimate elongation of at least 200%, as determined by ASTM D-412. Such gel materials may be polyurethane, silicone, polyolefinic block copolymers and other compositions which provide the above cone penetration and elongation properties necessary for the gel material to have high conformability under low compression forces to provide the environmental sealing of the metallic structure of the gasket and the surfaces between which the gasket is compressed. Such gel materials have been used to protect substrates from corrosion and to provide electrical insulation on certain electrical terminals and connectors to prevent electrical malfunction upon exposure to moisture. For example, such gel materials have been used in terminal lug protection caps for the telecommunication industries as shown in U.S. Ser. No. 504,000 filed June 13, 1983; in crimp connectors as shown in U.S. Ser. No. 507,433 filed June 23, 1983; in covers for metal articles as shown in U.S. Ser. No. 715,789 filed Mar. 25, 1985; in thermoformed articles as shown in U.S. Ser. No. 730,699 filed May 2, 1985, in splice case end seals as shown in U.S. Ser. No. 698,643 filed Feb. 6, 1985 and U.S. Ser. No. 730,697 filed May 2, 1985, in tape forms as shown in U.S. Ser. No. 507,435 filed June 26, 1983, Ser. No. 711,119 filed Mar. 12, 1985, Ser. No. 730,692 filed May 2, 1985, and Ser. No. 730,405 filed May 2, 1985, and in tape forms having a protective backing as shown in U.S. Ser. No. 864,689 filed May 19, 1986. Examples of such gel compositions and materials are shown in the above applications and in U.S. Ser. No. 730,402 filed May 2, 1985, U.S. Ser. No. 801,018 filed Nov. 22, 1985, and UK Ser. No. 8617559 filed July 18, 1986. The disclosures of the above applications, which are all commonly assigned with this application, are incorporated herein by reference.

The gels useful in the present invention in general have a cone penetration value from about 100 to about 350 ($10^{-10}$ mm). In many uses it is preferred that the gel have a cone penetration between about 150 and 350 and in some applications it is preferred that the cone penetration be between about 100 and about 300. The gels when used in relatively thin layers with appropriate covering layer may provide superior surface protection and sealing when the cone penetration is between about 250 and about 350. The ultimate elongation of the gel material should be at least 100% in order to provide good conformability with the surface of the substrate. Higher values are generally preferred in order to provide better sealing of the gel material to the surface of the substrate. It is generally preferred that the gel material have an elongation of at least 200% and in many applications an elongation of at least 500% is desired. In other applications it is preferred that the gel material have an elongation of at least 750%.

The gaskets of the present invention may be formed in flat shapes such as flat woven or knitted wire fabric or circular knitted or tubular braided structures. Such circular or tubular structures can also be flattened if a plate shape is desired. In general, lower compression forces may be used with the round gaskets to obtain the desired electrical shielding and environmental sealing with the gaskets of this invention. For example, pressure in a range of about 1 to about 10 is generally sufficient with round gaskets while the flat gaskets according to this invention may require pressure obtained in the range of about 5 to about 25 psi. Higher pressures can be used, but are not required. These pressures and forces are significantly lower than is typically required with the prior art rubber, foam and elastomeric gaskets and substantially lower than required with the particle filled plastic E.M.I. gaskets. Therefore, as will be apparent to those skilled in the art, the gaskets according to the present invention are easier to install and the desired E.M.I. shielding and environmental sealing can be obtained with much lower compressive forces thus making the gaskets of the present invention suitable for use on lighter weight devices and construction materials.

As also will be apparent to one skilled in the art, the gaskets of the present invention provide better rust and corrosion resistance because the gel material in the gaskets of the present invention encapsulates and protects not only the surfaces which are being sealed but also protects the metal structure of the gasket itself from environmental effects such as moisture or chemical exposure. Another interesting feature of the gaskets of the present invention is that even if some portion of the metal structure of the gasket is exposed to the environment and rust or corrodes up to the surface of the gel part of the gasket, the rust or corrosion will be halted at that point. The gasket as it is compressed and installed between the surfaces will continue to provide environmental sealing and electrical shielding provided that a sufficient amount of the metal structure is embedded within the gel and protected by the gel from further corrosion or rust.

The gaskets of the present invention can be made by any convenient method similar to the methods used in the above referenced copending applications for manufacturing tape and other structures containing gel or having gel as a component thereof. For example, the metallic structure can be filled with the liquid uncured gel material and cured in place within the metallic structure to either completely encapsulate the metallic structure or to leave a portion of the metallic structure exposed from the surface of the gel. Alternatively, the gaskets according to the present invention can be made by laminating the precured layer of gel and the metallic structure in one or more layers to provide sufficient gel material for the metallic structure being employed in the gasket. For example, an expanded metal mesh metallic structure can have a layer of precured gel laminated to one or both sides of the expanded metal mesh sheet. In another example, a sheet of precured gel having sufficient thickness could have two sheets of expanded metal mesh or other metallic structure laminated to the two sides of the gel sheet. In another example, a round gel rope can be fed through a braider or circular knitter and a wire structure braided or knitted on the exterior surface of the gel. Again, in the alternative, a tubular braided metal wire structure or circular knitted metal wire structure could be filled with the liquid uncured gel and the gel allowed to cure inside the braided or knitted wire structure either leaving the braided or knitted wire structure exposed or whereby the gel encapsulates or coats the entire knitted or braided wire structure. Other methods of making the gaskets of the present invention will be apparent to one skilled in the art following the teachings of this disclosure.

The description of the present invention is in the context of shielding and sealing the space between two surfaces. However, it is to be understood that the scope of the gaskets and methods of the present invention includes shielding and sealing the space between three, four or more surfaces. It will be readily apparent to one skilled in the art that the gaskets of this invention can easily be designed and shaped to be effective to seal the space where three or more surfaces come together. Therefore in this application the language "two surfaces" includes at least two or two or more surfaces within the scope thereof.

Referring now to the drawings to further illustrate and describe the present invention through specific embodiments hereof, FIG. 1 illustrates one embodiment of the present invention in the form of a woven metal fabric shown in FIGS. 1a and 1b which is woven from wires 1. In FIG. 1c the gasket of the present invention is illustrated wherein the woven metal fabric containing wires 1 is encapsulated in the cured gel 2. In FIG. 1d the gasket of FIG. 1c is installed and compressed between surfaces 3. Due to the compression, metal wires 1 contact the surfaces 3 at points 5 and the gel has been compressed and expanded into areas 4. As can be seen in FIG. 1d, the gel environmentally seals between surfaces 3 and encapsulates and environmentally protects the woven metal fabric formed from wires 1.

FIG. 2a shows a side view and end view of a gasket according to this invention constructed from a wire pipe cleaner or bottle brush type structure comprising center wire 6 and radial wires 7 which extend beyond the surface of the gel layer 8 within the wire structure. FIG. 2b shows a side view and end view of the gasket of FIG. 2a installed and compressed between surfaces 9. As can be seen in FIG. 2b wires 7 are in contact with surfaces 9 and the gel has been deformed and expanded into areas 10 where the gel has encapsulated and covered the ends of wires 7 which are not in direct contact with surfaces 9.

The gaskets of the present invention can further be illustrated by the following examples.

EXAMPLE 1

The ability of a woven wire cloth such as shown in FIG. 1 to attenuate across a 0.15 inch gap at frequencies between 10 MHz and 1 GHz was measured using the transfer impedance method called out in Society of Automotive Engineers SAE-ARP-1705 specification. The scan across the frequency range is illustrated in FIG. 3. It can be seen in this figure that the attenuation is in excess of 90 dB.

EXAMPLE 2

The wire cloth described in FIG. 1 was impregnated with a polydimethylsiloxane gel having a cone penetration of 260 mm$^{-1}$ and an elongation of 450 percent. A frequency versus attenuation scan was run on the impregnated cloth under conditions identical to those in Example 1. The resulting data is shown in FIG. 4. It can be seen in this figure that the scan is indistinguishable from FIG. 2 and thus shows the ability of the wire cloth to cut through the gel and make contact with the metal substrates when compressed in the test fixture.

EXAMPLE 3

A 0.156" diameter knitted wire strip made from 0.0045" Monel wire was measured for its ability to attenuate electromagnetic frequencies using the same technique outlined in the two previous examples. The scan can be found in FIG. 5.

EXAMPLE 4

The strip described in Example 3 was impregnated with polydimethylsiloxane of cone penetration 260 mm$^{-1}$ and elongation of 450 percent and then measured for shielding capabilities as described in the previous example. The scan is found in FIG. 6 and is almost identical to the unimpregnated version found in FIG. 5.

EXAMPLE 5

Corrosion testing of the woven wire cloth without gel impregnation described in Example 1 and of the gel gasket described in Example 2 was performed. Doughnut shaped specimens were punched out having a 1.75 inch outside diameter and a 1.25 inch inside diameter. The doughnuts were clamped between aluminum disks and exposed to salt spray per military standard Mil-STD-810. Resistivity changes were measured every 100 hours on the assemblies up to five hundred hours. FIG. 7 shows the changes for the impregnated and unimpregnated wire cloth. It can be seen that the conductivity of the joint is protected by the gel.

We claim:

1. An E.M.I. gasket for electrically shielding and environmentally sealing the space between two surfaces comprising:
   (a) a metallic electrically conductive deformable structure adapted for forming electrical contact with said surfaces and for providing electrical shielding in the space between said surfaces; and
   (b) a gel material for sealing the space between said surfaces having a cone penetration value of about 100 to about 350 (10$^{-1}$mm) and an ultimate elongation of at least 200% and being present in sufficient amount and positioned to provide an environmental seal between said surfaces and to provide environmental protection to said metallic structure; wherein at least a portion of the metallic structure is positioned and exposed outside the gel material and the gel material is positioned so as to deform into sealing contact with the surfaces and deform around the metallic structure to seal exposed portions of the metallic structure when the gasket is compressed between the surfaces.

2. A method of providing E.M.I. shielding and environmental sealing between two surfaces by positioning a gasket as defined in claim 1 between said two surfaces and compressing said gasket between said surfaces to deform the gel material and establish electrical contact of the metallic structure with said surfaces.

3. An assembly comprising two surfaces and a gasket as defined in claim 1 compressed between said surfaces.

4. A gasket according to claim 1, wherein the metallic structure is a knitted structure.

5. A gasket according to claim 1, wherein the metallic structure is an expanded metal mesh.

6. A gasket according to claim 1, wherein the metallic structure is a non-woven fabric.

7. An E.M.I. gasket for electrically shielding and environmentally sealing the space between two surfaces comprising:
   (a) a metallic electrically conductive deformable structure adapted for forming electrical contact with said surfaces and for providing electrical shielding in the space between said surfaces; and
   (b) a gel material for sealing the space between said surfaces having a cone penetration value of about 100 to about 350 (10$^{-1}$mm) and an ultimate elongation of at least 200% and being present in sufficient amount and positioned to provide an environmental seal between said surfaces and to provide environmental protection to said metallic structure; wherein the gel material covers the metallic structure and the metallic structure is adapted and positioned such that when the gasket is compressed between the surfaces, portions of said structure pierce through the gel material and contact the surfaces.

8. A method of providing E.M.I. shielding and environmental sealing between two surfaces by positioning a gasket as defined in claim 7 between said two surfaces and compressing said gasket between said surfaces to deform the gel material and establish electrical contact of the metallic structure with said surfaces.

9. An assembly comprising two surfaces and a gasket as defined in claim 7 compressed between said surfaces.

10. A gasket according to claim 7, wherein the metallic structure is a knitted structure.

11. A gasket according to claim 7, wherein the metallic structure is an expanded metal mesh.

12. A gasket according to claim 7, wherein the metallic structure is a non-woven fabric.

* * * * *